(12) United States Patent
Tani

(10) Patent No.: US 10,211,799 B2
(45) Date of Patent: Feb. 19, 2019

(54) HIGH-FREQUENCY FILTER

(71) Applicant: Murata Manufacturing Co., Ltd., Kyoto (JP)

(72) Inventor: Masakazu Tani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 102 days.

(21) Appl. No.: 15/188,491

(22) Filed: Jun. 21, 2016

(65) Prior Publication Data
US 2016/0301383 A1    Oct. 13, 2016

Related U.S. Application Data

(63) Continuation of application No. PCT/JP2014/084458, filed on Dec. 26, 2014.

(30) Foreign Application Priority Data

Dec. 27, 2013 (JP) ................................ 2013-270904
Jun. 2, 2014 (JP) ................................ 2014-113669

(51) Int. Cl.
*H03H 7/01* (2006.01)
*H03H 9/54* (2006.01)
(Continued)

(52) U.S. Cl.
CPC .......... *H03H 7/0153* (2013.01); *H03H 9/542* (2013.01); *H03H 9/568* (2013.01);
(Continued)

(58) Field of Classification Search
CPC .. H03H 9/64; H03H 7/12; H03H 9/17; H03H 9/54; H03H 9/542; H03H 9/568; H03H 9/6403; H03H 9/6483; H03H 2210/025
(Continued)

(56) References Cited

U.S. PATENT DOCUMENTS 5,291,159 A * 3/1994 Vale ........................ H03H 7/12
                                                            333/174
2002/0105391 A1* 8/2002 Yamada ................ H01P 1/2136
                                                            333/134
(Continued)

FOREIGN PATENT DOCUMENTS

JP      59-015319 A     1/1984
JP      2005-217852 A   8/2005
(Continued)

OTHER PUBLICATIONS

Written Opinion for PCT/JP2014/084458 dated Feb. 24, 2015.
(Continued)

*Primary Examiner* — Benny Lee
*Assistant Examiner* — Hafizur Rahman
(74) *Attorney, Agent, or Firm* — Pearne & Gordon LLP

(57) ABSTRACT

A high-frequency filter (10) includes a first input-output terminal (P1), a second input-output terminal (P2), a variable frequency filter (20), and a fixed frequency filter (30). The variable frequency filter (20) and the fixed frequency filter (30) are connected in series and coupled between the first input-output terminal (P1) and the second input-output terminal (P2). The variable frequency filter (20) is a filter capable of varying a passband and an attenuation band. The fixed frequency filter (30) is a filter having a fixed passband and a fixed attenuation band. The passband of the fixed frequency filter (30) is set so as to be at least partially overlapped with multiple passbands realized by the fixed frequency filter (30).

20 Claims, 12 Drawing Sheets

(51) Int. Cl.
  *H03H 9/60* (2006.01)
  *H03H 9/64* (2006.01)
  *H03H 9/56* (2006.01)

(52) U.S. Cl.
  CPC .......... *H03H 9/605* (2013.01); *H03H 9/6403* (2013.01); *H03H 9/6483* (2013.01); *H03H 2210/025* (2013.01)

(58) Field of Classification Search
  USPC ........................................................ 333/174
  See application file for complete search history.

(56) References Cited

U.S. PATENT DOCUMENTS

| | | |
|---|---|---|
| 2005/0212612 A1 | 9/2005 | Kawakubo et al. |
| 2010/0197257 A1* | 8/2010 | Rajkotia ............. H04B 1/1036 455/188.1 |
| 2011/0199168 A1 | 8/2011 | Kadota |
| 2012/0286900 A1 | 11/2012 | Kadota et al. |
| 2012/0313731 A1 | 12/2012 | Burgener et al. |
| 2013/0344836 A1 | 12/2013 | Rajkotia |
| 2014/0106698 A1 | 4/2014 | Mi et al. |
| 2014/0266511 A1* | 9/2014 | Turner ................. G06F 17/505 333/193 |

FOREIGN PATENT DOCUMENTS

| | | |
|---|---|---|
| JP | 4053504 B2 | 12/2007 |
| JP | 2008301223 A | 12/2008 |
| JP | 2009-130831 A | 6/2009 |
| JP | 2010098593 A | 4/2010 |
| JP | 2012-257050 A | 12/2012 |
| WO | 2010/058570 A1 | 5/2010 |
| WO | 2011/093449 A1 | 8/2011 |
| WO | 2013/005264 A1 | 1/2013 |

OTHER PUBLICATIONS

International Search report for PCT/JP2014/084458 dated Feb. 24, 2015.
Office action issued in Korean Application No. 10-2016-7016578 dispatched Aug. 11, 2017.

* cited by examiner

HIGH-FREQUENCY FILTER

FIELD OF THE DISCLOSURE

The present disclosure relates to a high-frequency filter using a resonant frequency and an anti-resonant frequency of a resonator.

BACKGROUND ART

Various high-frequency filters using resonators having resonant frequencies and anti-resonant frequencies have hitherto been devised. For example, Patent Documents 1 and 2 describe high-frequency filters capable of varying filter characteristics, such as bandpass characteristics and attenuation characteristics, using piezoelectric resonators.

The high-frequency filters described in Patent Documents 1 and 2 each have a circuit configuration in which a variable capacitor is connected in series or in parallel to the piezoelectric resonator. Each of the high-frequency filters described in Patent Documents 1 and 2 varies at least one of the resonant frequency and the anti-resonant frequency of a circuit composed of the piezoelectric resonator and the variable capacitor by adjusting the capacitance of the variable capacitor in order to adjust the filter characteristics. The filter characteristics include the bandpass characteristics and the attenuation characteristics.

Patent Document 1: Japanese Unexamined Patent Application Publication No. 2009-130831

Patent Document 2: Japanese Patent No. 4053504

BRIEF SUMMARY OF THE DISCLOSURE

However, since the Q value of the variable capacitor is lower than the Q value of the piezoelectric resonator, the high-frequency filter including the variable capacitor described above has a problem in that the bandpass characteristics and the attenuation characteristics are liable to be degraded, compared with a mode in which the variable capacitor is not used.

In contrast, no use of the variable capacitor prevents the filter characteristics, such as the bandpass characteristics and the attenuation characteristics, from being adjusted.

It is an object of the present disclosure to provide a high-frequency filter having excellent and variable filter characteristics.

The present disclosure provides a high-frequency filter having the following configuration. The high-frequency filter includes a variable frequency filter and a fixed frequency filter. The variable frequency filter includes a reactance varying unit and is capable of adjusting a passband frequency and an attenuation band frequency by adjusting the reactance varying unit. The fixed frequency filter does not include the reactance varying unit and has a fixed passband frequency and a fixed attenuation band frequency. The variable frequency filter is coupled to the fixed frequency filter. The passband of the fixed frequency filter is at least partially overlapped with the passband of the variable frequency filter.

With the above configuration, the filter characteristic of any of multiple communication bands subjected to a filtering process by the high-frequency filter is realized with the fixed frequency filter. Accordingly, the variable range of the variable frequency filter is narrowed, compared with a case in which the variable frequency filter performs the filtering process to all the communication bands. The variable frequency filter is capable of suppressing degradation of the filter characteristics as the variable range is narrowed down. In addition, the fixed frequency filter has excellent filter characteristics, compared with those of the variable frequency filter. Accordingly, with the above configuration, it is possible to improve the filter characteristics of the high-frequency filter.

In the high-frequency filter of the present disclosure, the variable frequency filter may include a variable filter resonator and the fixed frequency filter may include a fixed filter resonator. A resonant frequency or an anti-resonant frequency of a resonant circuit including the reactance varying unit and the resonator is optionally adjusted by the reactance varying unit to adjust the passband or the attenuation band of the variable frequency filter.

With the above configuration, since each filter uses the resonant frequency and the anti-resonant frequency of the resonator, the attenuation characteristic on the boundary between the passband and the attenuation band can be set to a relatively steep characteristic.

In the high-frequency filter of the present disclosure, the reactance varying unit may include an inductor connected in parallel to the variable filter resonator and a variable capacitor connected in series to the variable filter resonator. This configuration indicates the basic configuration of the reactance varying unit.

In the high-frequency filter of the present disclosure, a lower limit frequency of the passband of the fixed frequency filter may be approximately equal to a lower limit frequency of a lowest-frequency communication band, among multiple communication bands subjected to the filtering process by the high-frequency filter. In this case, the variable frequency filter may be a band pass filter or a high pass filter in the high-frequency filter.

With the above configuration, among the multiple communication bands, the filter characteristic of the lowest-frequency communication band is determined with the fixed frequency filter and the filter characteristics of the other communication bands are determined with the variable frequency filter. Accordingly, it is not necessary for the variable frequency filter to contribute to the determination of the lower limit frequency of the lowest-frequency communication band. Consequently, the variable range of the variable frequency filter is narrowed to improve the filter characteristics.

In the high-frequency filter of the present disclosure, an upper limit frequency of the passband of the fixed frequency filter may be approximately equal to an upper limit frequency of a highest-frequency communication band, among multiple communication bands subjected to the filtering process by the high-frequency filter. In this case, the variable frequency filter may be a band pass filter or a low pass filter in the high-frequency filter.

With the above configuration, among the multiple communication bands, the filter characteristic of the highest-frequency communication band is determined with the fixed frequency filter and the filter characteristics of the other communication bands are determined with the variable frequency filter. Accordingly, it is not necessary for the variable frequency filter to contribute to the determination of the upper limit frequency of the highest-frequency communication band. Consequently, the variable range of the variable frequency filter is narrowed to improve the filter characteristics.

In the high-frequency filter of the present disclosure, both the fixed frequency filter and the variable frequency filter may be low pass filters. With this configuration, the upper limit frequency can be varied without degrading the filter characteristics near the upper limit frequency of the passband.

In the high-frequency filter of the present disclosure, the reactance varying unit may include an inductor connected in parallel to the resonator and a variable capacitor connected in series to a parallel circuit composed of the resonator and the inductor. With this configuration, the low pass filter is realized with a simple configuration.

In the high-frequency filter of the present disclosure, both the fixed frequency filter and the variable frequency filter may be high pass filters. With this configuration, the lower limit frequency can be varied without degrading the filter characteristics near the lower limit frequency of the passband.

In the high-frequency filter of the present disclosure, the reactance varying unit may include an inductor connected in series to the resonator and a variable capacitor connected in parallel to a series circuit composed of the resonator and the inductor. With this configuration, the high pass filter is realized with a simple configuration.

In the high-frequency filter of the present disclosure, the variable frequency filter may include a variable filter resonator and the fixed frequency filter may include a fixed filter resonator. The reactance varying unit may be a unit that switches a connection mode of the variable frequency filter to the fixed frequency filter, and the passband and the attenuation band may be adjusted by varying a coupling state between the variable frequency filter and the fixed frequency filter through the switching. With this configuration, the filter characteristics can be switched with the simple circuit configuration.

In the high-frequency filter of the present disclosure, the reactance varying unit may include an inductor connected in parallel to the variable filter resonator and a switching element connected in parallel to the variable filter resonator. With this configuration, the reactance varying unit is realized with the simple configuration.

In the high-frequency filter of the present disclosure, the reactance varying unit may include an inductor connected in series to the variable frequency filter and a switching element connected in parallel to the variable filter resonator and the serially-connected inductor. With this configuration, the reactance varying unit is realized with the simple configuration.

In the high-frequency filter of the present disclosure, the reactance varying unit may include a resonator and an inductor connected in parallel between a transmission line and ground and a switching element connected between the parallel circuit composed of the resonator and the inductor and the transmission line. With this configuration, the reactance varying unit is realized with the simple configuration.

In the high-frequency filter of the present disclosure, the fixed frequency filter may include multiple fixed frequency filters or the variable frequency filter may include multiple variable frequency filters, or the fixed frequency filter may include multiple fixed frequency filters and the variable frequency filter may include multiple variable frequency filters. With this configuration, desired filter characteristics are more reliably realized.

According to the present disclosure, it is possible to realize the excellent filter characteristics while varying the filter characteristics.

DETAILED DESCRIPTION OF THE DISCLOSURE

Figure 1:
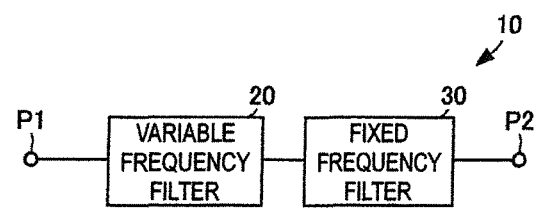
FIG. 1 is a block diagram of a high-frequency filter according to a first embodiment of the present disclosure.

A high-frequency filter according to a first embodiment of the present disclosure will herein be described with reference to the attached drawings. FIG. 1 is a block diagram of the high-frequency filter according to the first embodiment of the present disclosure.

As illustrated in FIG. 1, a high-frequency filter 10 includes a first input-output terminal P1, a second input-output terminal P2, a variable frequency filter 20, and a fixed frequency filter 30. The variable frequency filter 20 and the fixed frequency filter 30 are connected in series between the first input-output terminal P1 and the second input-output terminal P2, and the variable frequency filter 20 is coupled to the fixed frequency filter 30. The coupling between the variable frequency filter 20 and the fixed frequency filter 30 enables the high-frequency filter 10 to realize desired filter characteristics (bandpass characteristics and attenuation characteristics).

The variable frequency filter 20 is capable of varying the frequency range of a passband and the frequency range of an attenuation band although a specific circuit configuration of the variable frequency filter 20 will be described below. The variable frequency filter 20 is capable of setting arbitrary frequency bands for the passband and the attenuation band, not discretely, within predetermined frequency ranges. In other words, the variable frequency filter 20 is different from a filter which has fixed frequency ranges for the passband and the attenuation band, which uses multiple filters having different passbands and attenuation bands, and in which the multiple filters are connected in series to each other without being coupled to each other or a filter in which multiple filters having independent filter characteristics are switched with a switch for connection.

The fixed frequency filter 30 has a fixed passband and a fixed attenuation band although a specific circuit configuration of the fixed frequency filter 30 will be described below. The frequency range of the passband of the fixed frequency filter 30 is set so as to be overlapped with at least one of the frequency ranges of multiple passbands realized by the variable frequency filter 20.

Figure 2:
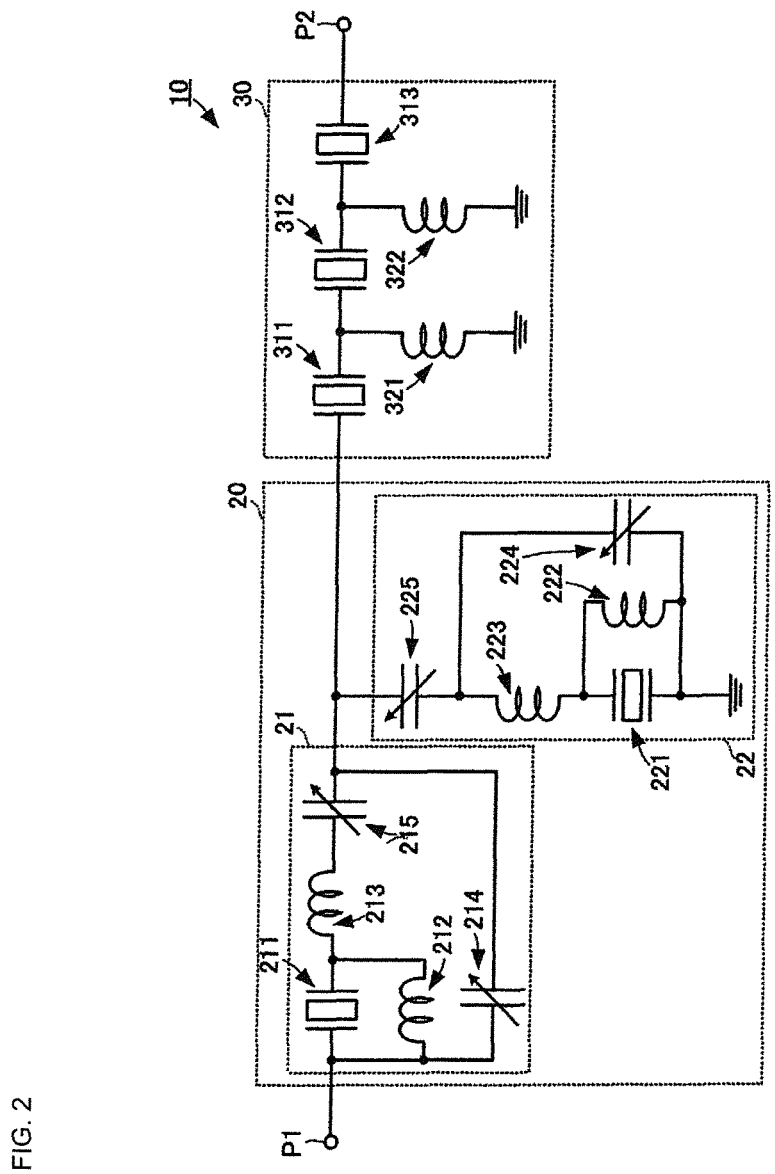
FIG. 2 is a circuit diagram of the high-frequency filter according to the first embodiment of the present disclosure.

FIG. 2 is a circuit diagram of the high-frequency filter according to the first embodiment of the present disclosure. As illustrated in FIG. 2, the variable frequency filter 20 includes resonant circuits 21 and 22. Coupling between the resonant circuits 21 and 22 determines the filter characteristics of the variable frequency filter 20. The resonant circuit 21 is connected between the first input-output terminal P1 and the fixed frequency filter 30. In other words, the resonant circuit 21 is connected in series to a transmission line of high-frequency signals. The resonant circuit 22 is connected between the transmission line connecting the resonant circuit 21 to the fixed frequency filter 30 and the ground. In other words, the resonant circuit 22 is connected in parallel to the transmission line.

The resonant circuit 21 includes a piezoelectric resonator 211, inductors 212 and 213, and variable capacitors 214 and 215. The piezoelectric resonator 211, the inductor 213, and the variable capacitor 215 are connected in series between the first input-output terminal P1 and the fixed frequency filter 30. The piezoelectric resonator 211, the inductor 213, and the variable capacitor 215 are coupled in this order from the first input-output terminal P1 side. The inductor 212 is connected in parallel to the piezoelectric resonator 211. The variable capacitor 214 is coupled in parallel to a series circuit composed of the piezoelectric resonator 211, the inductor 213, and the variable capacitor 215.

The inductors 212 and 213 are used to extend the interval between the resonant frequency and the anti-resonant frequency of the resonant circuit 21 with respect to the interval between the resonant frequency and the anti-resonant frequency of the piezoelectric resonator 211. The resonant frequency and the anti-resonant frequency that are extended are adjustable with the variable capacitors 214 and 215. The inductors 212 and 213 and the variable capacitors 214 and 215 correspond to a reactance varying unit of the present disclosure. The inductors 212 and 213 are not necessarily provided in the resonant circuit 21 and the presence of the inductors 212 and 213 may be appropriately determined on the basis of a communication band supported by the high-frequency filter 10.

The resonant circuit 22 includes a piezoelectric resonator 221, inductors 222 and 223, and variable capacitors 224 and 225. The piezoelectric resonator 221, the inductor 223, and the variable capacitor 225 are connected in series between the transmission line and the ground. The piezoelectric resonator 221, the inductor 223, and the variable capacitor 225 are connected in this order from the ground side. The inductor 222 is connected in parallel to the piezoelectric resonator 221. The variable capacitor 224 is connected in parallel to a series circuit composed of the piezoelectric resonator 221 and the inductor 223.

The inductors 222 and 223 are used to extend the interval between the resonant frequency and the anti-resonant frequency of the resonant circuit 22 with respect to the interval between the resonant frequency and the anti-resonant frequency of the piezoelectric resonator 221. The resonant frequency and the anti-resonant frequency that are extended are adjustable with the variable capacitors 224 and 225. The inductors 222 and 223 and the variable capacitors 224 and 225 correspond to the reactance varying unit of the present disclosure. The inductors 222 and 223 are not necessarily provided in the resonant circuit 22 and the presence of the inductors 222 and 223 may be appropriately determined on the basis of the communication band supported by the high-frequency filter 10.

The piezoelectric resonators 211 and 221 are each realized by a surface acoustic wave (SAW) resonator or a boundary acoustic wave (BAW) resonator. For example, the SAW resonator is realized by forming interdigital transducer (IDT) electrodes on the surface of a lithium niobate substrate of a certain cut type (for example, Y-cut).

The inductors 212, 213, 222, and 223 are realized by, for example, electrode patterns formed on a mount board on which the piezoelectric resonators 211 and 221 are mounted or chip components mounted on the surface of the mount board. The variable capacitors 214, 215, 224, and 225 are realized by, for example, chip components mounted on the surface of the mount board on which the piezoelectric resonators 211 and 221 are mounted.

With the above configuration, adjustment of the capacitances of the variable capacitors 214 and 215 adjusts impedance characteristics of the resonant circuit 21. Adjustment of the capacitances of the variable capacitors 224 and 225 adjusts impedance characteristics of the resonant circuit 22. Combination of the impedance characteristics of the resonant circuits 21 and 22 adjusted in the above manner realizes filter characteristics (bandpass characteristics and attenuation characteristics) desirable for the variable frequency filter 20. Specifically, the resonant frequency of the resonant circuit 21 and a secondary anti-resonant frequency of the resonant circuit 22 form the passband, and the anti-resonant frequency of the resonant circuit 21 and the resonant frequency of the resonant circuit 22 form the attenuation band. The adjustment of the resonant frequency, the anti-resonant frequency, the second anti-resonant frequency, and so on of the resonant circuits 21 and 22 with the capacitances of the variable capacitors 214, 215, 224, and 225 allows the bandpass characteristics of the variable frequency filter 20 to be adjusted.

In addition, the inductors 212, 213, 222, and 223 are called extension inductors. The frequency width that can be adjusted with the capacitances of the variable capacitors 214, 215, 224, and 225 can be widened with these inductors. In other words, the provision of the inductors 212, 213, 222, and 223 widens the frequency range from which the bandpass characteristics of the variable frequency filter 20, which are achieved by adjusting the resonant circuits 21 and 22, can be selected.

The fixed frequency filter 30 includes piezoelectric resonators 311, 312, and 313 and inductors 321 and 322.

The piezoelectric resonators 311, 312, and 313 are connected in series between the variable frequency filter 20 and the second input-output terminal P2. The inductor 321 is connected between the transmission line connecting the piezoelectric resonator 311 to the piezoelectric resonator 312 and the ground. The inductor 322 is connected between the transmission line connecting the piezoelectric resonator 312 to the piezoelectric resonator 313 and the ground. The fixed frequency filter 30 includes no variable capacitor, as described above.

With the above configuration, the fixed frequency filter 30 functions as a high pass filter the passband and the attenuation band of which are fixed. Appropriately setting the element values of the piezoelectric resonators 311, 312, and 313 and the inductors 321 and 322 causes a lower limit frequency of the passband of the fixed frequency filter 30 to be approximately equal to a lower limit frequency of the passband in a lowest-frequency communication band, among multiple communication bands subjected to a filtering process by the high-frequency filter 10. The lower limit frequency of the passband of the fixed frequency filter 30 is, for example, a cut-off frequency at the low frequency side of the passband of the fixed frequency filter 30. Similarly, the lower limit frequency of the passband of the high-frequency filter 10 in the lowest-frequency communication band is, for example, a cut-off frequency at the low frequency side of the passband of the high-frequency filter 10 in the lowest-frequency communication band.

Setting the fixed frequency filter 30 in the above manner eliminates the necessity of the variable frequency filter 20 to contribute to the setting of the lower limit frequency of the passband in the lowest-frequency communication band. Accordingly, the range in which the frequency of the variable frequency filter 20 is varied is made narrower than that in a mode in which the passband and the attenuation band corresponding to all the communication bands subjected to the filtering process by the high-frequency filter 10 are set only with the variable frequency filter 20. This inhibits degradation of the filter characteristics of the variable frequency filter 20.

In addition, since no variable capacitor having a low Q value is included in the fixed frequency filter 30, the filter characteristics for the communication band supported by the fixed frequency filter 30 are improved, compared with those for the communication band supported by the variable frequency filter 20.

Figure 3:
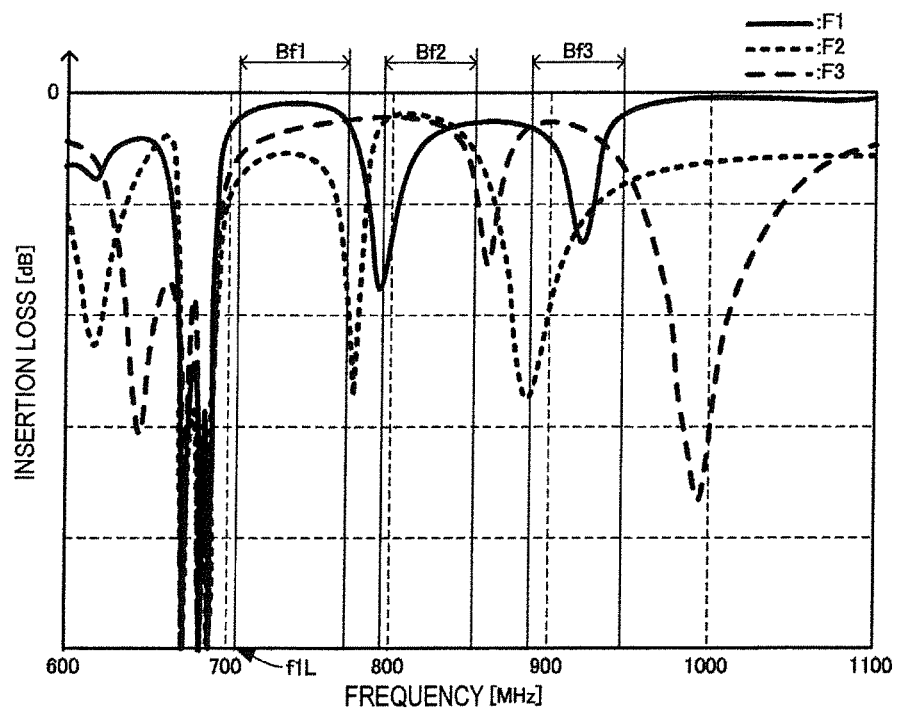
FIG. 3 is a graph illustrating bandpass characteristics of the high-frequency filter according to the first embodiment of the present disclosure.
Figure 4A:
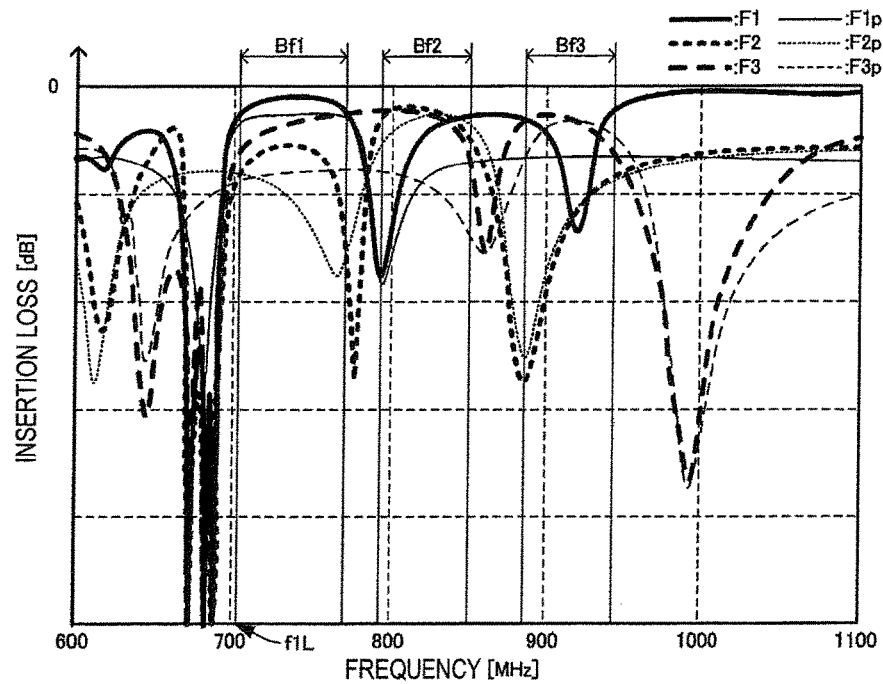
FIGS. 4A and 4B include diagrams for comparing the bandpass characteristics of the high-frequency filter according to the first embodiment of the present disclosure with the bandpass characteristics of a high-frequency filter in a comparative example.
Figure 4B:
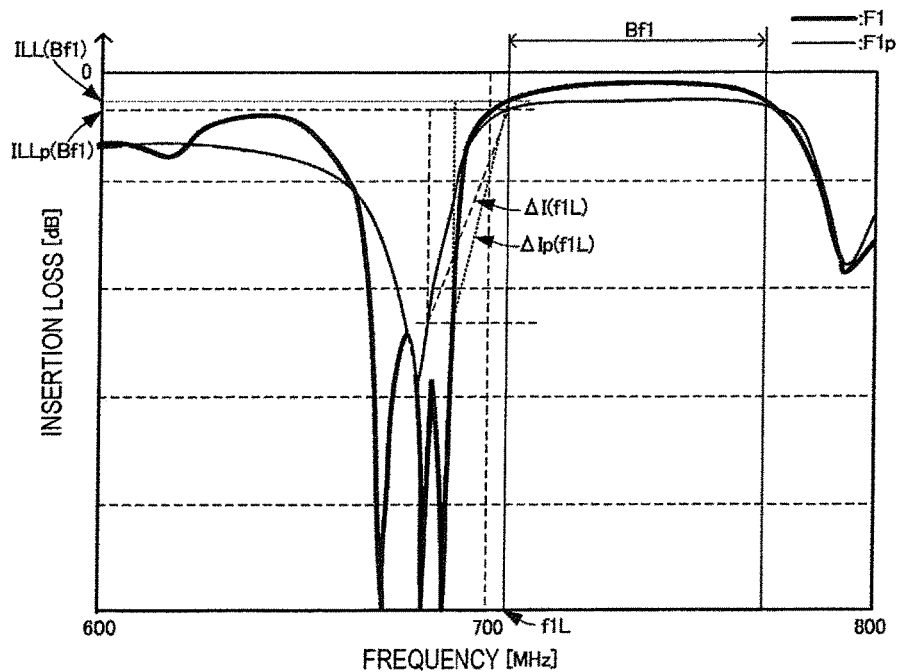

FIG. 3 is a graph illustrating bandpass characteristics of the high-frequency filter according to the first embodiment of the present disclosure. FIGS. 4A and 4B include diagrams for comparing the bandpass characteristics of the high-frequency filter according to the first embodiment of the present disclosure with the bandpass characteristics of a high-frequency filter in a comparative example. FIG. 4A is a graph illustrating the characteristics in all frequency bands subjected to the filtering process by the high-frequency filter and FIG. 4B is a graph illustrating the characteristics with a first communication band being enlarged. The high-frequency filter in the comparative example is composed of only the variable frequency filter 20 in the high-frequency filter 10 according to the present embodiment.

Referring to FIG. 3 and FIGS. 4A and 4B, an F1 characteristic indicated by a bold solid line illustrates a characteristic when the capacitance of the variable capacitor is adjusted so that the first communication band passes through the filter in a mode in which the high-frequency filter 10 according to the present embodiment is used. An F2 characteristic indicated by a bold dotted line illustrates a characteristic when the capacitance of the variable capacitor is adjusted so that a second communication band passes through the filter in the mode in which the high-frequency filter 10 according to the present embodiment is used. An F3 characteristic indicated by a bold dashed line illustrates a characteristic when the capacitance of the variable capacitor is adjusted so that a third communication band passes through the filter in the mode in which the high-frequency filter 10 according to the present embodiment is used. The center frequency of the passband of the second communication band is higher than that of the first communication band, and the center frequency of the passband of the third communication band is higher than that of the second communication band. Referring to FIG. 3 and FIGS. 4A and 4B, Bf1 indicates the passband of the first communication band, Bf2 indicates the passband of the second communication band, and Bf3 indicates the passband of the third communication band. Referring to FIG. 3 and FIGS. 4A and 4B, f1L indicates the lower limit frequency of the passband Bf1 of the first communication band.

As illustrated in FIG. 3 and FIGS. 4A and 4B, the use of the high-frequency filter 10 according to the present embodiment allows the filter characteristic for the second communication band to be kept at least approximately equal to that for the third communication band. The filter characteristic for a communication band which is at least equal to the filter characteristic for another communication band means that the lowest insertion loss in the passband of the communication band is approximately equal to or smaller than that of the other communication band.

The use of the high-frequency filter 10 according to the present embodiment allows the filter characteristics for the first communication band to be further improved, especially illustrated in FIG. 4B.

Specifically, as illustrated in FIG. 4B, a rate of change Δl (f1L) from the lower limit frequency f1L of the passband Bf1 of the high-frequency filter 10 to a certain insertion loss (attenuation) toward the low frequency side is higher than a rate of change Δlp (f1L) of the insertion loss (attenuation) in the comparative example. In other words, the attenuation characteristic near the lower limit frequency f1L of the passband Bf1 of the high-frequency filter 10 is steeper than the attenuation characteristic in the comparative example.

In addition, as illustrated in FIG. 4B, a lowest insertion loss ILL (Bf1) in the passband Bf1 of the high-frequency filter 10 is smaller than a lowest insertion loss ILLp (Bf1) in the passband Bf1 in the comparative example. In other words, the high-frequency filter 10 is capable of transmitting the high-frequency signals with lower insertion loss in the passband Bf1, compared with the comparative example.

Figure 5:
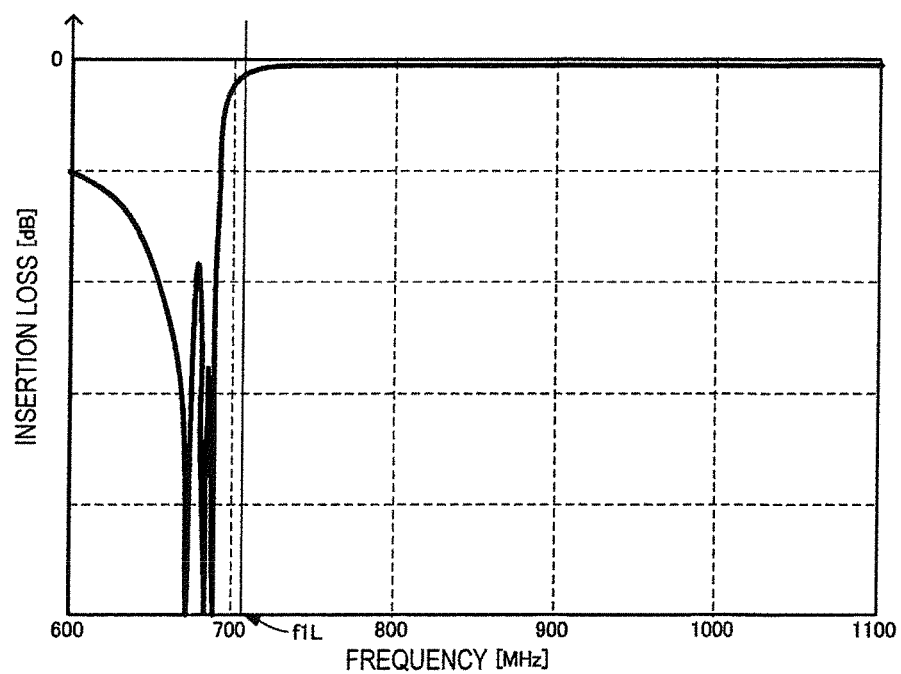
FIG. 5 is a graph illustrating the bandpass characteristics of a fixed frequency filter according to the first embodiment of the present disclosure.

The following principle contributes to such improvement of the filter characteristics. FIG. 5 is a graph illustrating the bandpass characteristics of the fixed frequency filter. As illustrated in FIG. 5, the fixed frequency filter 30 is a high pass filter and the lower limit frequency of the passband of the fixed frequency filter 30 is approximately equal to the lower limit frequency f1L of the passband Bf1 described above. In the fixed frequency filter 30, the insertion loss in the passband is smaller than the insertion loss in the passband Bf1 of the first communication band in the mode in which only the variable frequency filter 20 is used. Using the fixed frequency filter 30 and causing the fixed frequency filter 30 to contribute to the formation of the passband Bf1 of the first communication band allow the excellent filter characteristics illustrated in FIG. 3 and FIGS. 4A and 4B to be realized.

Figure 6:
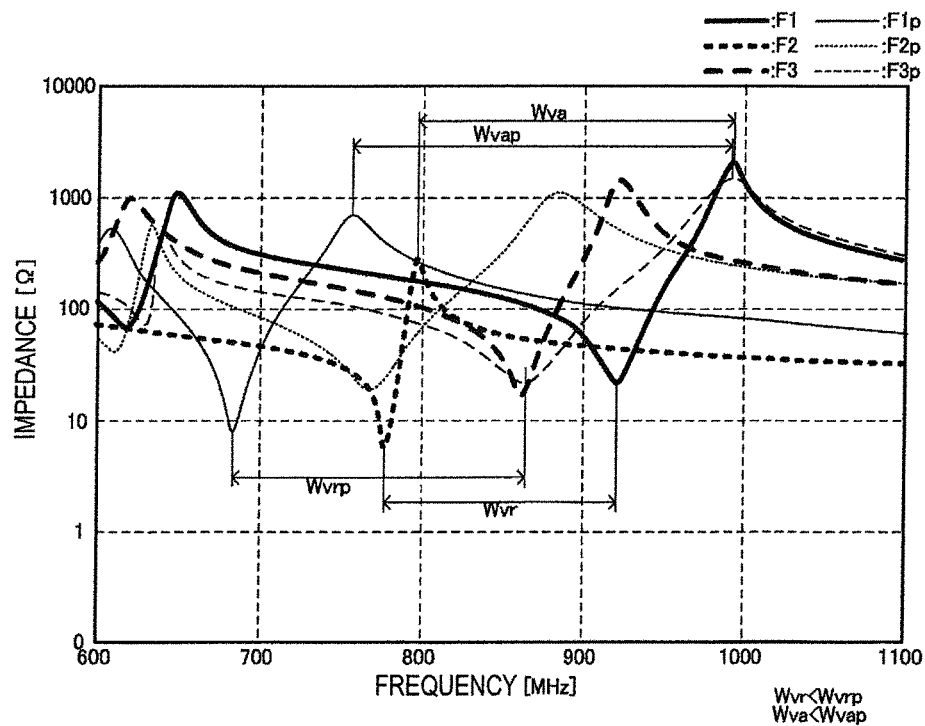
FIG. 6 is a graph illustrating impedance characteristics of a variable frequency resonant circuit (a variable frequency resonant circuit that is shunt-connected) in a variable frequency filter according to the first embodiment of the present disclosure.

FIG. 6 is a graph illustrating the impedance characteristics of the resonant circuit (the resonant circuit connected between a transmission line and the ground) in the variable frequency filter. Referring to FIG. 6, the F1 characteristic indicated by a bold solid line illustrates the characteristic for the first communication band in the mode in which the high-frequency filter 10 according to the present embodiment is used, the F2 characteristic indicated by a bold dotted line illustrates the characteristic for the second communication band in the mode in which the high-frequency filter 10 according to the present embodiment is used, and the F3 characteristic indicated by a bold dashed line illustrates the characteristic for the third communication band in the mode in which the high-frequency filter 10 according to the present embodiment is used, as in FIG. 3 and FIGS. 4A and 4B.

As illustrated in FIG. 6, a variable width Wvr of the resonant frequency in the mode in which the high-frequency filter 10 is used is narrower than a variable width Wvrp of the resonant frequency in the mode in which the comparative example is used (Wvr<Wvrp). In addition, a variable width Wva of the anti-resonant frequency in the mode in which the high-frequency filter 10 is used is narrower than a variable width Wvap of the anti-resonant frequency in the mode in which the comparative example is used (Wva<Wvap). The narrow variable widths of the resonant frequency and the anti-resonant frequency allow the variable width of the capacitance value (capacitance) of the variable capacitor to be narrowed. For example, in a case in which the variable capacitor is made of Barium Strontium Titanate (BST) or is formed of a digitally tunable capacitor (DTC), the variable capacitor having a narrow variable width of the capacitance value has a Q value higher than that of the variable capacitor having a wide variable width of the capacitance value. Accordingly, the Q value of the resonant circuit is improved. Consequently, the filter characteristics based on the resonant circuit is improved to realize the excellent filter characteristics illustrated in FIG. 3 and FIGS. 4A and 4B described above.

Figure 7A:
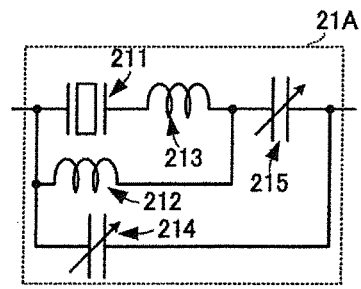
FIGS. 7A and 7B include diagrams illustrating exemplary circuit configurations of the variable frequency resonant circuit according to the first embodiment of the present disclosure.
Figure 7B:
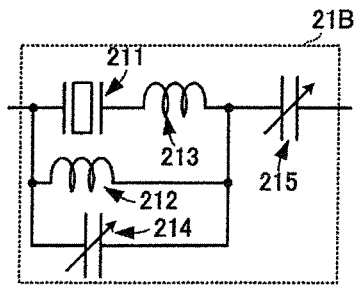

Each of the resonant circuits 21 and 22 is not limited to have the above configuration and may have configurations illustrated in FIG. 7A and FIG. 7B. FIGS. 7A and 7B include diagrams illustrating exemplary circuit configurations of the resonant circuit according to the first embodiment of the present disclosure. Although exemplary derivations of the resonant circuit 21 are illustrated below, similar exemplary derivations can be realized for the resonant circuit 22.

The circuit configuration of the resonant circuit 21 described above may be applied to the resonant circuit 22 and the circuit configuration of the resonant circuit 22 may be applied to the resonant circuit 21. Alternatively, the resonant circuits 21 and 22 may have the same circuit configuration and the resonant circuit 21 may differ from the resonant circuit 22 in element values.

In a resonant circuit 21A illustrated FIG. 7A, the inductor 212 is connected in parallel to the series circuit composed of the piezoelectric resonator 211 and the inductor 213. The remaining configuration of the resonant circuit 21A is the same as that of the resonant circuit 21. In a resonant circuit 21B illustrated in FIG. 7B, the inductor 212 is connected in parallel to the series circuit composed of the piezoelectric resonator 211 and the inductor 213. The remaining configuration of the resonant circuit 21B is the same as that of the resonant circuit 22. Adjusting the series relationship between the inductor and the variable capacitor connected in series to the piezoelectric resonator 211 and the parallel relationship between the inductor and the variable capacitor connected in parallel to the piezoelectric resonator 211 in the above manner allows the resonant frequency and the anti-resonant frequency of the resonant circuit to be set so as to be appropriate for the filter characteristics required by the variable frequency filter.

Although the high pass filter is exemplified in the above description, a low pass filter or a band pass filter may be used. When the low pass filter is used, an upper limit frequency of the passband of the low pass filter may be caused to be approximately equal to the upper limit frequency of the passband Bf3 described above. The upper limit frequency of the passband means, for example, a cut-off frequency of the passband at the high frequency side. When the band pass filter is used, the lower limit frequency of the passband of the band pass filter may be caused to be approximately equal to the lower limit frequency of any of the communication bands or the upper limit frequency of the passband of the band pass filter may be caused to be approximately equal to the upper limit frequency of any of the communication bands.

Figure 8:
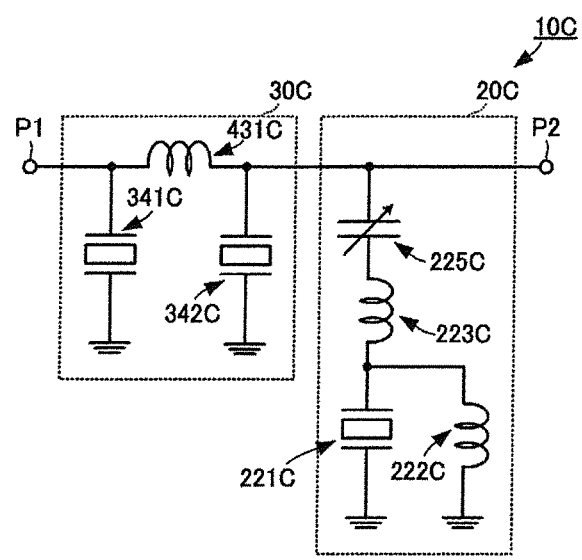
FIG. 8 is a circuit diagram of a high-frequency filter according to a second embodiment of the present disclosure.
Figure 9:
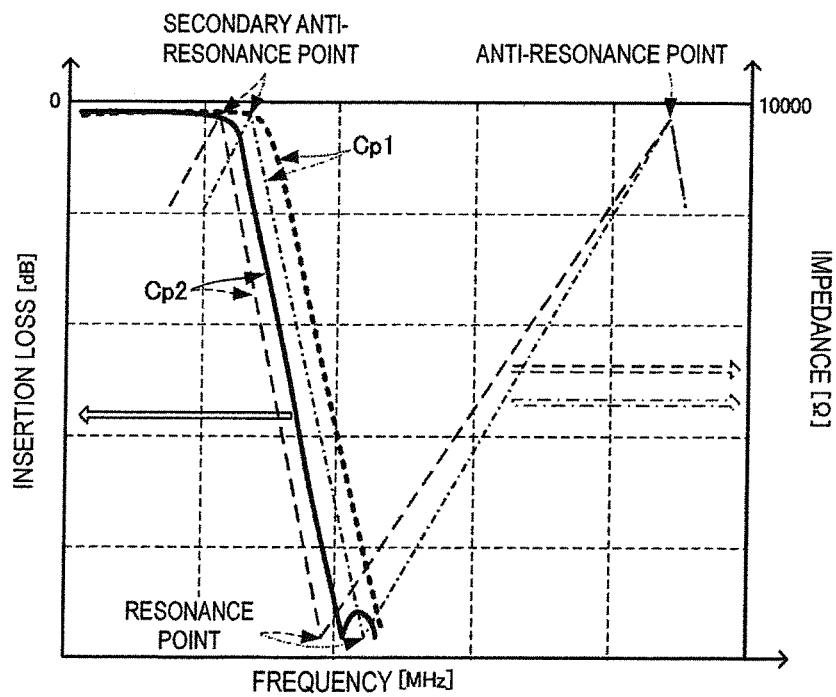
FIG. 9 is a graph illustrating the bandpass characteristics of the high-frequency filter according to the second embodiment of the present disclosure and the relationship between the bandpass characteristics and the impedance characteristics of a variable frequency filter.

A high-frequency filter according to a second embodiment of the present disclosure will herein be described with reference to the attached drawings. FIG. 8 is a circuit diagram of the high-frequency filter according to the second embodiment of the present disclosure. FIG. 9 is a graph illustrating the bandpass characteristics of the high-frequency filter according to the second embodiment of the present disclosure and the impedance characteristics of a resonant circuit composing the bandpass characteristics and a variable frequency filter. Referring to FIG. 9, a bold solid line and a bold dotted line indicate the bandpass characteristics of the high-frequency filter and a thin dashed line and a thin alternating long and short dashed line indicate the impedance characteristics of the resonant circuit.

A high-frequency filter 10C illustrated in FIG. 8 includes a variable frequency filter 20C and a fixed frequency filter 30C. The variable frequency filter 20C and the fixed frequency filter 30C are connected in series between the first input-output terminal P1 and the second input-output terminal P2 and are coupled to each other. The coupling between the variable frequency filter 20C and the fixed frequency filter 30C enables the high-frequency filter 10C to realize desired filter characteristics (bandpass characteristics and attenuation characteristics).

The variable frequency filter 20C includes a piezoelectric resonator 221C, inductors 222C and 223C, and a variable capacitor 225C.

The piezoelectric resonator 221C, the inductor 223C, and the variable capacitor 225C are connected in series between a connection line connecting the second input-output terminal P2 to the fixed frequency filter 30C and the ground. The variable capacitor 225C, the inductor 223C, and the piezoelectric resonator 221C are connected in this order from the connection line side. The inductor 222C is connected in parallel to the piezoelectric resonator 221C. The inductor 222C serves as an inductor that forms a second anti-resonance point that does not occur only with the piezoelectric resonator 221C in proximity to the resonance point and at the low frequency side of the resonance point in a resonant circuit including the inductor 222C and the piezoelectric resonator 221C. The second anti-resonance point occurs at the low frequency side of the resonance point of the piezoelectric resonator 221C and corresponds to a secondary anti-resonance point of the present disclosure.

With this configuration, varying the capacitance of the variable capacitor 225C allows the frequency at the secondary anti-resonance point and the frequency at the resonance point to be varied to the same extent, as illustrated by the alternating long and short dashed line (capacitance=Cp1) and the broken line (capacitance=Cp2) in FIG. 9.

Causing the frequency at the secondary anti-resonance point to contribute to the determination of the upper limit frequency of the passband and causing the frequency at the resonance point to contribute to the determination of the attenuation band cause the variable frequency filter 20C to function as a low pass filter capable of adjusting the upper limit frequency of the passband and the bandpass characteristics and the attenuation characteristics near the upper limit frequency.

The fixed frequency filter 30C includes piezoelectric resonators 341C and 342C and an inductor 431C. The inductor 431C is connected between the first input-output terminal P1 and the variable frequency filter 20C. The piezoelectric resonator 341C is connected between a connection line connecting the inductor 431C to the first input-output terminal P1 and the ground. The piezoelectric resonator 342C is connected between a connection line connecting the inductor 431C to the variable frequency filter 20C and the ground. In the above configuration, the fixed frequency filter 30C functions as a low pass filter.

The upper limit frequency of the passband of the fixed frequency filter 30C is close to the frequency range of the upper limit frequency of the passband of the variable frequency filter 20C or the upper limit frequency of the passband of the fixed frequency filter 30C is included in the frequency range of the upper limit frequency of the passband of the variable frequency filter 20C.

With the above configuration, as illustrated by the bold dotted line (capacitance=Cp1) and the bold solid line (capacitor=Cp2) in FIG. 9, the passband frequency can be varied without varying the steepness of the attenuation near the upper limit frequency of the passband. Accordingly, it is possible to inhibit the degradation of the filter characteristics, compared with a case in which the passband and the attenuation band are varied only with the variable frequency filter, as in the related art.

The inductor 223C composing the variable frequency filter 20C described above is the extension inductor described above and may be omitted depending on the communication band supported by the high-frequency filter 10C.

Figure 10:
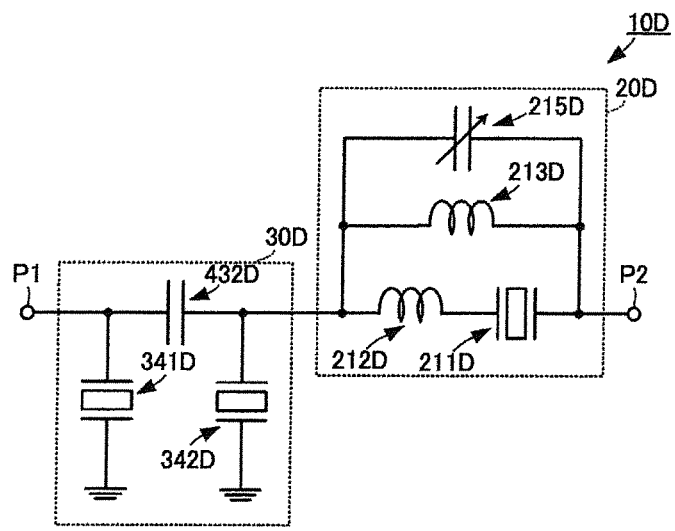
FIG. 10 is a circuit diagram of a high-frequency filter according to a third embodiment of the present disclosure.
Figure 11:
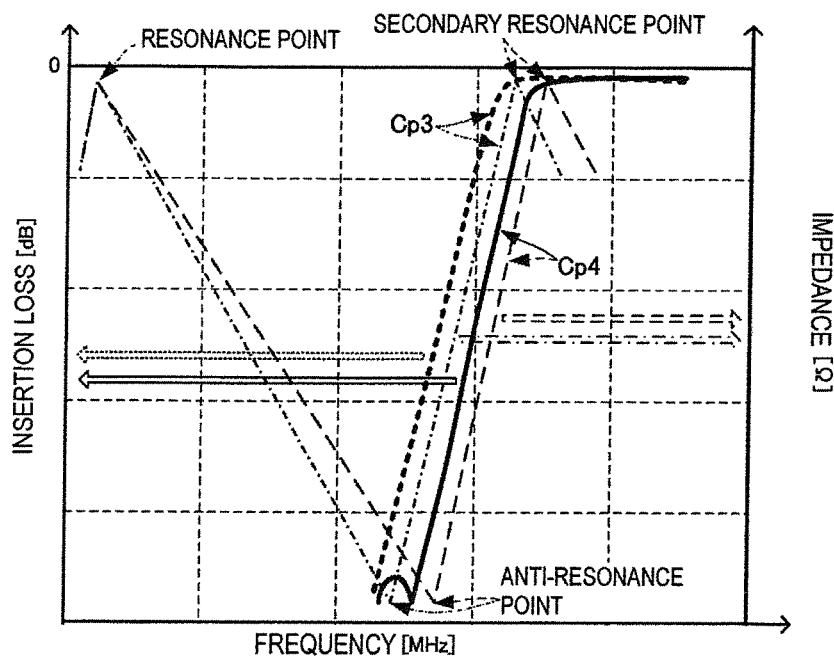
FIG. 11 is a graph illustrating the bandpass characteristics of the high-frequency filter according to the third embodiment of the present disclosure and the relationship between the bandpass characteristics and the impedance characteristics of a variable frequency filter.

A high-frequency filter according to a third embodiment of the present disclosure will herein be described with reference to the attached drawings. FIG. 10 is a circuit diagram of the high-frequency filter according to the third embodiment of the present disclosure. FIG. 11 is a graph illustrating the bandpass characteristics of the high-frequency filter according to the third embodiment of the present disclosure and the impedance characteristics of a resonant circuit composing the bandpass characteristics and a variable frequency filter. Referring to FIG. 11, a bold solid line and a bold dotted line indicate the bandpass characteristics of the high-frequency filter and a thin dashed line and a thin alternating long and short dashed line indicate the impedance characteristics of the resonant circuit.

A high-frequency filter 10D illustrated in FIG. 10 includes a variable frequency filter 20D and a fixed frequency filter 30D. The variable frequency filter 20D and the fixed frequency filter 30D are connected in series between the first input-output terminal P1 and the second input-output terminal P2 and are coupled to each other. The coupling between the variable frequency filter 20D and the fixed frequency filter 30D enables the high-frequency filter 10D to realize desired filter characteristics.

The variable frequency filter 20D includes a piezoelectric resonator 211D, inductors 212D and 213D, and a variable capacitor 215D.

The piezoelectric resonator 211D and the inductor 212D are connected in series between the second input-output terminal P2 and the fixed frequency filter 30D. The inductor 213D and the variable capacitor 215D are connected in parallel to a series circuit composed of the piezoelectric resonator 211D and the inductor 212D. The inductor 213D serves as an inductor that forms a second resonance point that does not occur only with the piezoelectric resonator 221D in proximity to the anti-resonance point and at the high frequency side of the anti-resonance point in a resonant circuit including the inductor 213D and the piezoelectric resonator 211D. The second resonance point occurs at the high frequency side of the anti-resonance point of the piezoelectric resonator 221D and corresponds to a secondary resonance point of the present disclosure.

With this configuration, varying the capacitance of the variable capacitor 215D allows the frequency at the anti-resonance point and the frequency at the secondary resonance point to be varied to the same extent, as illustrated by the alternating long and short dashed line (capacitance=Cp3) and the broken line (capacitance=Cp4) in FIG. 11.

Causing the frequency at the secondary resonance point to contribute to the determination of the upper limit frequency of the passband and causing the frequency at the anti-resonance point to contribute to the determination of the attenuation band cause the variable frequency filter 20D to function as a high pass filter capable of adjusting the lower limit frequency of the passband and the bandpass characteristics and the attenuation characteristics near the lower limit frequency.

The fixed frequency filter 30D includes piezoelectric resonators 341D and 342D and a capacitor 432D. The capacitor 432D is connected between the first input-output terminal P1 and the variable frequency filter 20D. The piezoelectric resonator 341D is connected between a connection line connecting the capacitor 432D to the first input-output terminal P1 and the ground. The piezoelectric resonator 342D is connected between a connection line connecting the capacitor 432D to the variable frequency filter 20D and the ground. In the above configuration, the fixed frequency filter 30D functions as a high pass filter.

The lower limit frequency of the passband of the fixed frequency filter 30D is close to the frequency range of the lower limit frequency of the passband of the variable frequency filter 20D or the lower limit frequency of the passband of the fixed frequency filter 30D is included in the frequency range of the lower limit frequency of the passband of the variable frequency filter 20D.

With the above configuration, as illustrated by the bold dotted line (capacitance=Cp3) and the bold solid line (capacitor=Cp4) in FIG. 11, the passband frequency can be varied without varying the steepness of the attenuation near the lower limit frequency of the passband. Accordingly, it is possible to inhibit the degradation of the filter characteristics, compared with the case in which the passband and the attenuation band are varied only with the variable frequency filter, as in the related art.

Figure 12:
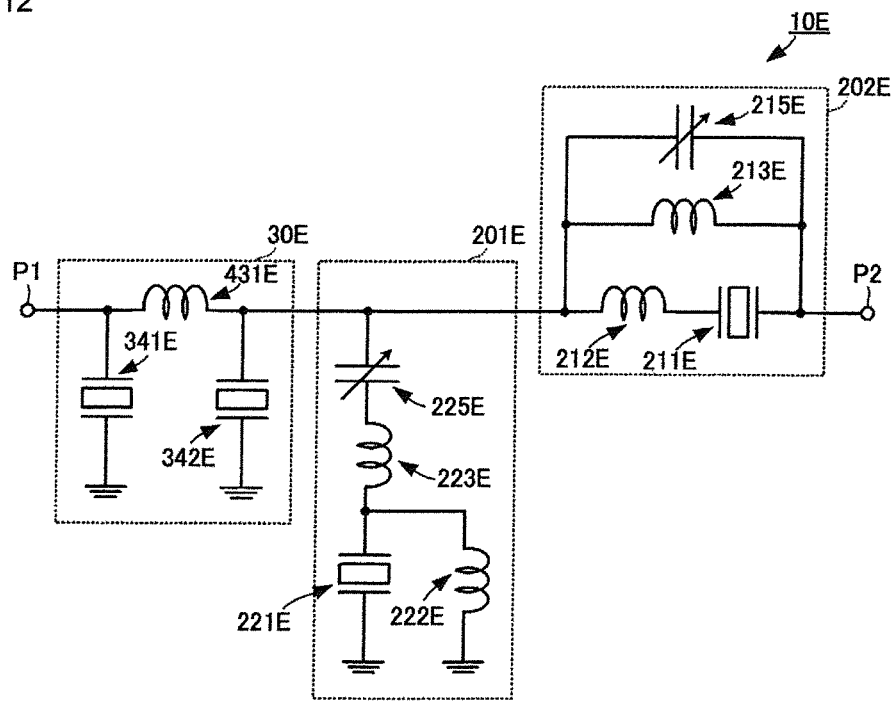
FIG. 12 is a circuit diagram of a high-frequency filter according to a fourth embodiment of the present disclosure.
Figure 13:
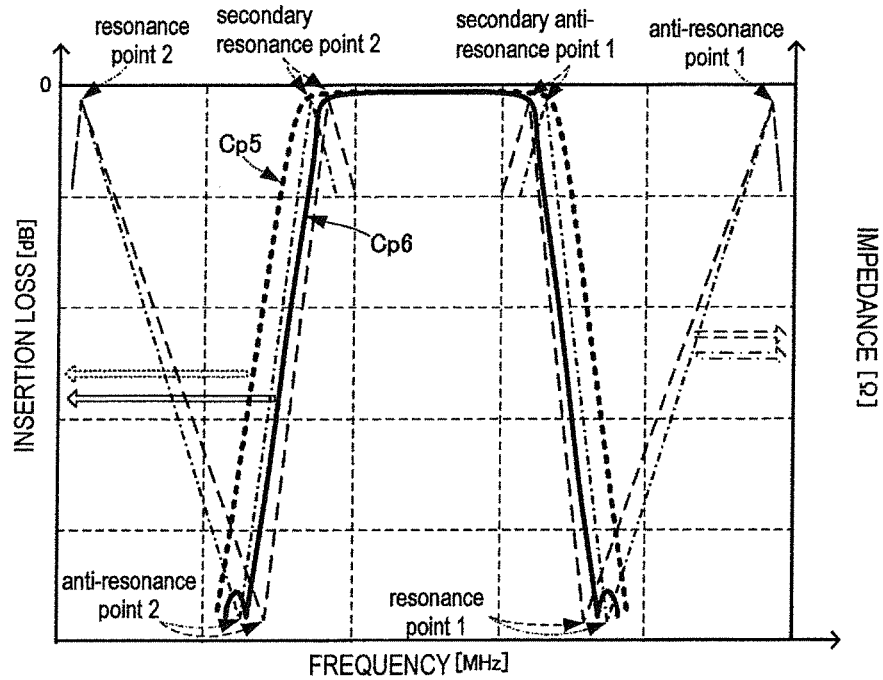
FIG. 13 is a graph illustrating the bandpass characteristics of the high-frequency filter according to the fourth embodiment of the present disclosure and the relationship between the bandpass characteristics and the impedance characteristics of a variable frequency filter.

A high-frequency filter according to a fourth embodiment of the present disclosure will herein be described with reference to the attached drawings. FIG. 12 is a circuit diagram of the high-frequency filter according to the fourth embodiment of the present disclosure. FIG. 13 is a graph illustrating the bandpass characteristics of the high-frequency filter according to the fourth embodiment of the present disclosure and the impedance characteristics of a resonant circuit composing the bandpass characteristics and a variable frequency filter. Referring to FIG. 13, a bold solid line and a bold dotted line indicate the bandpass characteristics of the high-frequency filter and a thin dashed line and a thin alternating long and short dashed line indicate the impedance characteristics of the resonant circuit.

A high-frequency filter 10E according to the present embodiment has a configuration in which the high-frequency filter 10C according to the second embodiment is combined with the high-frequency filter 10D according to the third embodiment.

The high-frequency filter 10E illustrated in FIG. 12 includes variable frequency filters 201E and 202E and a fixed frequency filter 30E. The variable frequency filters 201E and 202E and the fixed frequency filter 30E are connected in series between the first input-output terminal P1 and the second input-output terminal P2 and are coupled to each other. The coupling between the variable frequency filters 201E and 202E and the fixed frequency filter 30E enables the high-frequency filter 10E to realize desired filter characteristics.

The variable frequency filter 201E includes a piezoelectric resonator 221E, inductors 222E and 223E, and a variable capacitor 225E.

The piezoelectric resonator 221E, the inductor 223E, and the variable capacitor 225E are connected in series between a connection line connecting the fixed frequency filter 30E to the variable frequency filter 202E and the ground. The inductor 222E is connected in parallel to the piezoelectric resonator 221E. In the above configuration, the variable frequency filter 201E functions as a low pass filter capable of adjusting the upper limit frequency of the passband and the bandpass characteristics and the attenuation characteristics near the upper limit frequency.

The variable frequency filter 202E includes a piezoelectric resonator 211E, inductors 212E and 213E, and a variable capacitor 215E.

The piezoelectric resonator 211E and the inductor 212E are connected in series between the second input-output terminal P2 and the variable frequency filter 201E. The inductor 213E and the variable capacitor 215E are connected in parallel to a series circuit composed of the piezoelectric resonator 211E and the inductor 212E.

In the above configuration, the variable frequency filter 202E functions as a high pass filter capable of adjusting the lower limit frequency of the passband and the bandpass characteristics and the attenuation characteristics near the lower limit frequency.

The fixed frequency filter 30E includes piezoelectric resonators 341E and 342E and an inductor 431E. The inductor 431E is connected between the first input-output terminal P1 and the variable frequency filter 201E. The piezoelectric resonator 341E is connected between a connection line connecting the inductor 431E to the first input-output terminal P1 and the ground. The piezoelectric resonator 342E is connected between a connection line connecting the inductor 431E to the variable frequency filter 201E and the ground. In the above configuration, the fixed frequency filter 30E functions as a low pass filter.

The upper limit frequency of the passband of the fixed frequency filter 30E is close to the frequency range of the upper limit frequency of the passband of the variable frequency filter 201E or the upper limit frequency of the passband of the fixed frequency filter 30E is included in the frequency range of the upper limit frequency of the passband of the variable frequency filter 201E. The provision of the variable frequency filters 201E and 202E and the fixed frequency filter 30E having the above configuration composes a band pass filter.

With the above configuration, as illustrated by the bold dotted line (capacitance=Cp5) and the bold solid line (capacitor=Cp6) in FIG. 13, the band width of the passband can be varied without varying the steepness of the attenuation near the upper limit frequency and the lower limit frequency of the passband. Accordingly, it is possible to inhibit the degradation of the filter characteristics, compared with the case in which the passband and the attenuation band are varied only with the variable frequency filter of the band pass type, as in the related art.

Figure 14:
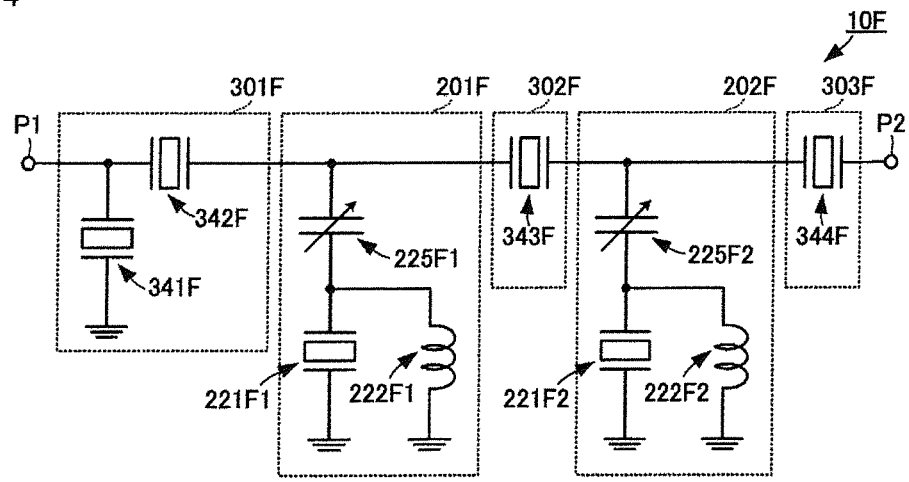
FIG. 14 is a circuit diagram of a high-frequency filter according to a fifth embodiment of the present disclosure.

A high-frequency filter according to a fifth embodiment of the present disclosure will herein be described with reference to the attached drawing. FIG. 14 is a circuit diagram of the high-frequency filter according to the fifth embodiment of the present disclosure.

A high-frequency filter 10F illustrated in FIG. 14 includes variable frequency filters 201F and 202F and fixed frequency filters 301F, 302F, and 303F. The variable frequency filters 201F and 202F and the fixed frequency filters 301F, 302F, and 303F are connected in series between the first input-output terminal P1 and the second input-output terminal P2 and are coupled to each other. The fixed frequency filter 301F, the variable frequency filter 201F, the fixed frequency filter 302F, the variable frequency filter 202F, and the fixed frequency filter 303F are connected and coupled in this order from the first input-output terminal P1 side. The coupling between the variable frequency filters 201F and 202F and the fixed frequency filters 301F, 302F, and 303F enables the high-frequency filter 10F to realize desired filter characteristics.

The variable frequency filter 201F includes a piezoelectric resonator 221F1, an inductor 222F1, and a variable capacitor 225F1.

The piezoelectric resonator 221F1 and the variable capacitor 225F1 are connected in series between a connection line connecting the fixed frequency filter 301F to the fixed frequency filter 302F and the ground. The inductor 222F1 is connected in parallel to the piezoelectric resonator 221F1.

The variable frequency filter 202F includes a piezoelectric resonator 221F2, an inductor 222F2, and a variable capacitor 225F2.

The piezoelectric resonator 221F2 and the variable capacitor 225F2 are connected in series between a connection line connecting the fixed frequency filter 302F and the fixed frequency filter 303F and the ground. The inductor 222F2 is connected in parallel to the piezoelectric resonator 221F2.

The fixed frequency filter 301F includes piezoelectric resonators 341F and 342F. The piezoelectric resonator 342F is connected between the first input-output terminal P1 and the variable frequency filter 201F. The piezoelectric resonator 341F is connected between a connection line connecting the piezoelectric resonator 342F to the first input-output terminal P1 and the ground.

The fixed frequency filter 302F includes a piezoelectric resonator 343F. The piezoelectric resonator 343F is connected between the variable frequency filter 201F and the variable frequency filter 202F.

The fixed frequency filter 303F includes a piezoelectric resonator 344F. The piezoelectric resonator 344F is connected between the variable frequency filter 202F and the second input-output terminal P2.

As described above, the high-frequency filter 10F according to the present embodiment has a configuration in which the multiple variable frequency filters and the multiple fixed frequency filters are connected in series to each other.

Even with the above configuration, it is possible to inhibit the degradation of the filter characteristics, compared with the case in which the passband and the attenuation band are varied only with the variable frequency filter, as in the related art.

Figure 15:
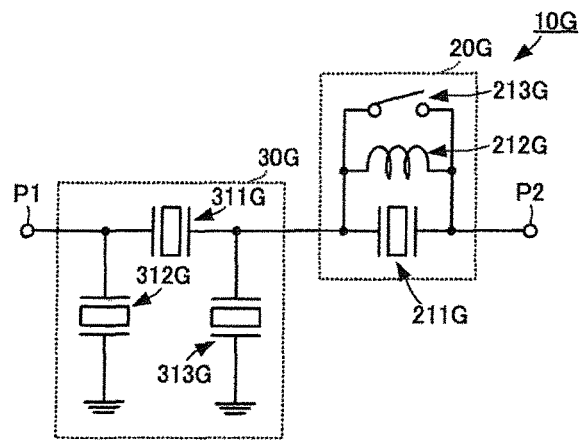
FIG. 15 is a circuit diagram of a high-frequency filter according to a sixth embodiment of the present disclosure.
Figure 16:
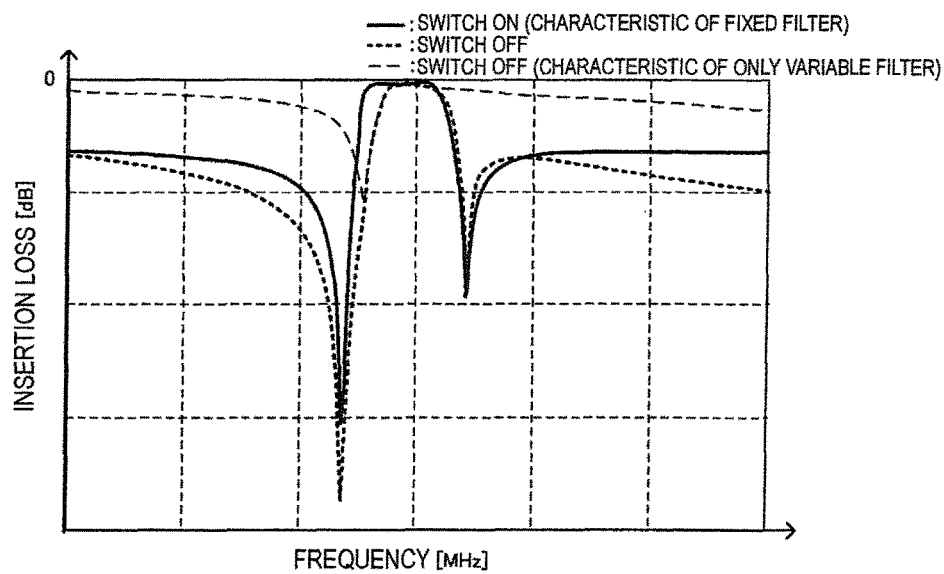
FIG. 16 is a graph illustrating the bandpass characteristics of the high-frequency filter according to the sixth embodiment of the present disclosure.

A high-frequency filter according to a sixth embodiment of the present disclosure will herein be described with reference to the attached drawings. FIG. 15 is a circuit diagram of the high-frequency filter according to the sixth embodiment of the present disclosure. FIG. 16 is a graph illustrating the bandpass characteristics of the high-frequency filter according to the sixth embodiment of the present disclosure. Referring to FIG. 16, a bold solid line indicates a filter characteristic in a state in which a switching element (switch) is short-circuited, a bold dotted line indicates a filter characteristic in a state in which the switch is open, and a thin broken line indicates a filter characteristic of a variable frequency filter in the state in which the switch is open.

A high-frequency filter 10G illustrated in FIG. 15 includes a variable frequency filter 20G and a fixed frequency filter 30G. The variable frequency filter 20G and the fixed frequency filter 30G are connected in series between the first input-output terminal P1 and the second input-output terminal P2 and are coupled to each other. The coupling between the variable frequency filter 20G and the fixed frequency filter 30G enables the high-frequency filter 10G to realize desired filter characteristics.

The variable frequency filter 20G includes a piezoelectric resonator 211G, an inductor 212G, and a switching element 213G. The inductor 212G and the switching element 213G correspond to the reactance varying unit of the present disclosure.

The piezoelectric resonator 211G is connected in series between the first input-output terminal P1 and the fixed frequency filter 30G. The inductor 212G is connected in parallel to the piezoelectric resonator 211G. The switching element 213G is connected in parallel to the inductor 212G.

When the switching element 213G is open, the variable frequency filter 20G is composed of a parallel circuit including the piezoelectric resonator 211G and the inductor 212G. Accordingly, as illustrated by the broken line in FIG. 16, the variable frequency filter 20G functions as a notch filter. When the switching element 213G is short-circuited, the variable frequency filter 20G is practically composed of only the switching element 213G that is short-circuited.

The fixed frequency filter 30G includes piezoelectric resonators 311G, 312G, and 313G. The piezoelectric resonator 311G is connected in series between the first input-output terminal P1 and the variable frequency filter 20G. The piezoelectric resonator 312G is connected between an end portion of the piezoelectric resonator 311G at the first input-output terminal P1 side and the ground. The piezoelectric resonator 313G is connected between an end portion of the piezoelectric resonator 311G at the variable frequency filter 20G side and the ground. With this configuration, as illustrated by the solid line in FIG. 16, the fixed frequency filter 30G functions as a band pass filter.

With this configuration, when the switching element 213G is open, the high-frequency filter 10G is a series circuit including the band pass filter composed of the fixed frequency filter 30G and the low pass filter composed of the variable frequency filter 20G. In contrast, when the switching element 213G is short-circuited, the high-frequency filter 10G is practically composed of only the band pass filter composed of the fixed frequency filter 30G.

In the above configuration, the lower limit frequency of the passband of the low pass filter composed of the variable frequency filter 20G is set so as to be higher than the lower limit frequency of the passband of the band pass filter composed of the fixed frequency filter 30G.

With the above setting, when the switching element 213G is open, the lower limit frequency of the passband is determined by the notch filter composing the variable frequency filter 20G, as illustrated by the dotted line in FIG. 16. In contrast, when the switching element 213G is short-circuited, the filter characteristic of the band pass filter composed of the fixed frequency filter 30G is the filter characteristic of the high-frequency filter 10G, as illustrated by the solid line in FIG. 16.

Even with the above configuration, it is possible to achieve the same effects and advantages as those in the above embodiments. In addition, since the switching element is used instead of the variable capacitor in the present embodiment, the circuit configuration is simplified.

Figure 17:
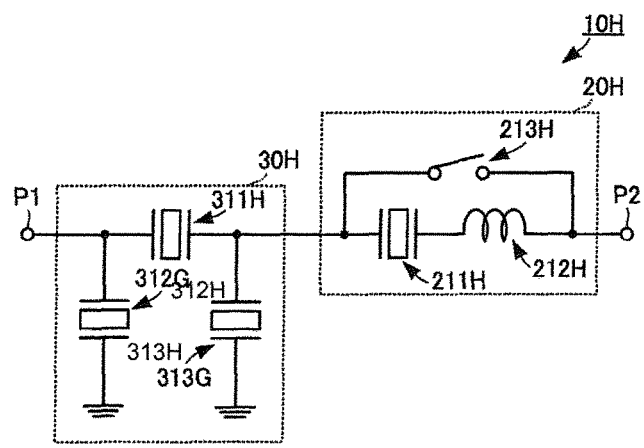
FIG. 17 is a circuit diagram of a high-frequency filter according to a seventh embodiment of the present disclosure.
Figure 18:
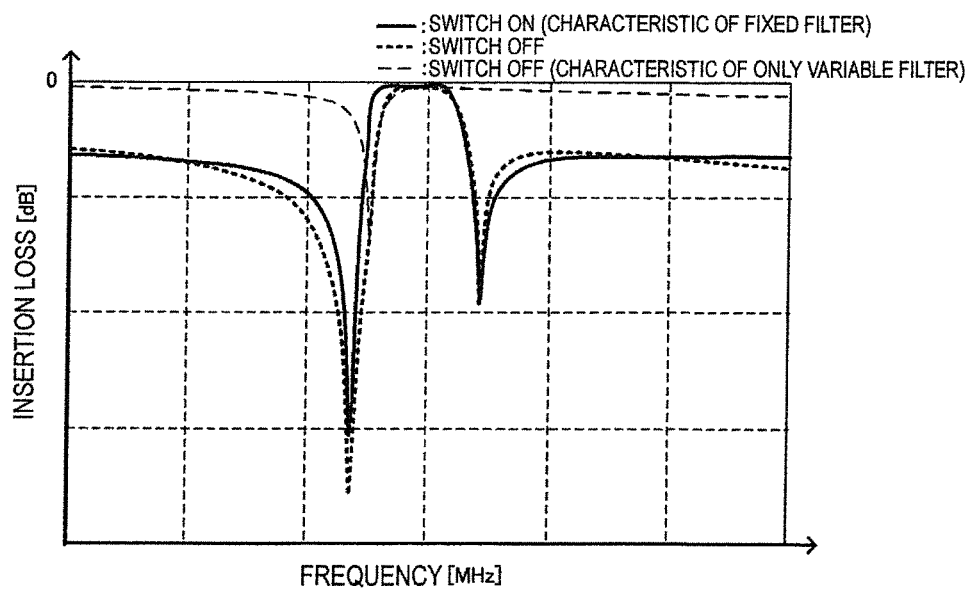
FIG. 18 is a graph illustrating the bandpass characteristics of the high-frequency filter according to the seventh embodiment of the present disclosure.

A high-frequency filter according to a seventh embodiment of the present disclosure will herein be described with reference to the attached drawings. FIG. 17 is a circuit diagram of the high-frequency filter according to the seventh embodiment of the present disclosure. FIG. 18 is a graph illustrating the bandpass characteristics of the high-frequency filter according to the seventh embodiment of the present disclosure. Referring to FIG. 18, a bold solid line indicates a filter characteristic in the state in which a switching element (switch) is short-circuited, a bold dotted line indicates a filter characteristic in the state in which the switch is open, and a thin broken line indicates a filter characteristic of a variable frequency filter in the state in which the switch is open.

A high-frequency filter 10H illustrated in FIG. 17 includes a variable frequency filter 20H and a fixed frequency filter 30H. The variable frequency filter 20H and the fixed frequency filter 30H are connected in series between the first input-output terminal P1 and the second input-output terminal P2 and are coupled to each other. The coupling between the variable frequency filter 20H and the fixed frequency filter 30H enables the high-frequency filter 10H to realize desired filter characteristics.

The variable frequency filter 20H includes a piezoelectric resonator 211H, an inductor 212H, and a switching element 213H. The inductor 212H and the switching element 213H correspond to the reactance varying unit of the present disclosure.

The piezoelectric resonator 211H and the inductor 212H are connected in series between the second input-output terminal P2 and the fixed frequency filter 30H. The switching element 213H is connected in parallel to a series circuit composed of the piezoelectric resonator 211H and the inductor 212H.

When the switching element 213H is open, the variable frequency filter 20H is composed of the series circuit including the piezoelectric resonator 211H and the inductor 212H.

Accordingly, as illustrated by the broken line in FIG. 18, the variable frequency filter 20H functions as a notch filter. When the switching element 213H is short-circuited, the variable frequency filter 20H is practically composed of only the switching element 213H that is short-circuited.

The fixed frequency filter 30H includes piezoelectric resonators 311H, 312H, and 313H. The piezoelectric resonator 311H is connected in series between the first input-output terminal P1 and the variable frequency filter 20H. The piezoelectric resonator 312H is connected between an end portion of the piezoelectric resonator 311H at the first input-output terminal P1 side and the ground. The piezoelectric resonator 313H is connected between an end portion of the piezoelectric resonator 311H at the variable frequency filter 20H side and the ground. With this configuration, as illustrated by the solid line in FIG. 18, the fixed frequency filter 30H functions as a band pass filter.

With this configuration, when the switching element 213H is open, the high-frequency filter 10H is a series circuit including the band pass filter composed of the fixed frequency filter 30H and the notch filter composed of the variable frequency filter 20H. In contrast, when the switching element 213H is short-circuited, the high-frequency filter 10H is practically composed of only the band pass filter composed of the fixed frequency filter 30H.

In the above configuration, the attenuation pole frequency of the notch filter composed of the variable frequency filter 20H is set so as to be higher than the lower limit frequency of the passband of the band pass filter composed of the fixed frequency filter 30H.

With the above setting, when the switching element 213H is open, the lower limit frequency of the passband is determined by the notch filter composing the variable frequency filter 20H, as illustrated by the dotted line in FIG. 18. In contrast, when the switching element 213H is short-circuited, the filter characteristic of the band pass filter composed of the fixed frequency filter 30H is the filter characteristic of the high-frequency filter 10H, as illustrated by the solid line in FIG. 18.

Even with the above configuration, it is possible to achieve the same effects and advantages as those in the above embodiments. In addition, since the switching element is used instead of the variable capacitor in the present embodiment, the circuit configuration is simplified.

Figure 19:
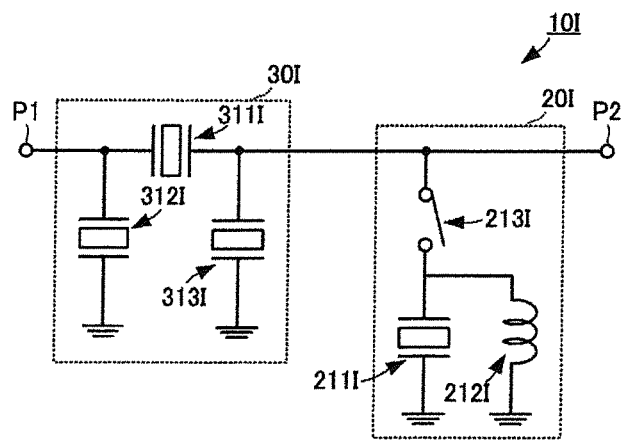
FIG. 19 is a circuit diagram of a high-frequency filter according to an eighth embodiment of the present disclosure.
Figure 20:
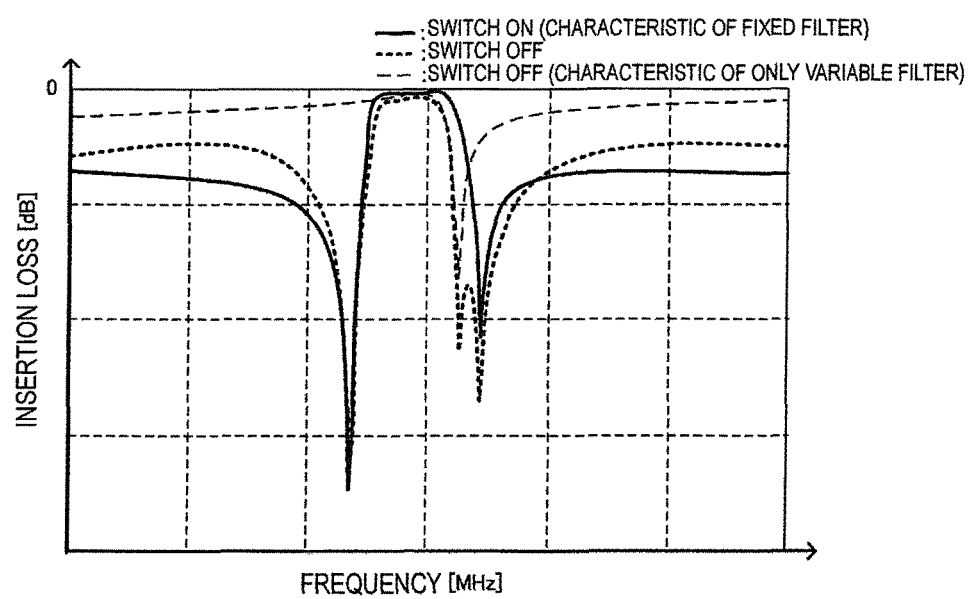
FIG. 20 is a graph illustrating the bandpass characteristics of the high-frequency filter according to the eighth embodiment of the present disclosure.

A high-frequency filter according to an eighth embodiment of the present disclosure will herein be described with reference to the attached drawings. FIG. 19 is a circuit diagram of the high-frequency filter according to the eighth embodiment of the present disclosure. FIG. 20 is a graph illustrating the bandpass characteristics of the high-frequency filter according to the eighth embodiment of the present disclosure. Referring to FIG. 20, a bold solid line indicates a filter characteristic in the state in which a switching element is open, a bold dotted line indicates a filter characteristic in the state in which the switch is short-circuited, and a thin broken line indicates a filter characteristic of a variable frequency filter in the state in which the switch is short-circuited.

A high-frequency filter 10I illustrated in FIG. 19 includes a variable frequency filter 20I and a fixed frequency filter 30I. The variable frequency filter 20I and the fixed frequency filter 30I are connected in series between the first input-output terminal P1 and the second input-output terminal P2 and are coupled to each other. The coupling between the variable frequency filter 20I and the fixed frequency filter 30I enables the high-frequency filter 10I to realize desired filter characteristics.

The variable frequency filter 20I includes a piezoelectric resonator 211I, an inductor 212I, and a switching element 213I. The inductor 212I and the switching element 213I correspond to the reactance varying unit of the present disclosure.

The piezoelectric resonator 211I is connected in parallel to the inductor 212I and one end of this parallel circuit is grounded. The other end of this parallel circuit is connected to a transmission line connecting the fixed frequency filter 30I to the second input-output terminal P2 via the switching element 213I.

When the switching element 213I is short-circuited, the variable frequency filter 20I has a configuration in which the parallel circuit composed of the piezoelectric resonator 211I and the inductor 212I is connected between the transmission line and the ground. Accordingly, as illustrated by the broken line in FIG. 20, the variable frequency filter 20I functions as a notch filter. When the switching element 213I is open, the variable frequency filter 20I is not connected to the transmission line.

The fixed frequency filter 30I includes piezoelectric resonators 311I, 312I, and 313I. The piezoelectric resonator 311I is connected in series between the first input-output terminal P1 and the variable frequency filter 20I. The piezoelectric resonator 312I is connected between an end portion of the piezoelectric resonator 311I at the first input-output terminal P1 side and the ground. The piezoelectric resonator 313I is connected between an end portion of the piezoelectric resonator 311I at the variable frequency filter 20I side and the ground. With this configuration, as illustrated by the solid line in FIG. 20, the fixed frequency filter 30I functions as a band pass filter.

With this configuration, when the switching element 213I is short-circuited, the high-frequency filter 10I is a series circuit including the band pass filter composed of the fixed frequency filter 30I and the notch filter composed of the variable frequency filter 20I. In contrast, when the switching element 213I is open, the high-frequency filter 10I is practically composed of only the band pass filter composed of the fixed frequency filter 30I.

In the above configuration, the attenuation pole frequency of the notch filter composed of the variable frequency filter 20I is set so as to be lower than the upper limit frequency of the passband of the band pass filter composed of the fixed frequency filter 30I.

With the above setting, when the switching element 213I is open, the upper limit frequency of the passband is determined by the notch filter composing the variable frequency filter 20I, as illustrated by the dotted line in FIG. 20. In contrast, when the switching element 213I is short-circuited, the filter characteristic of the band pass filter composed of the fixed frequency filter 30I is the filter characteristic of the high-frequency filter 10I, as illustrated by the solid line in FIG. 20.

Even with the above configuration, it is possible to achieve the same effects and advantages as those in the above embodiments. In addition, since the switching element is used instead of the variable capacitor in the present embodiment, the circuit configuration is simplified.

10, 10C, 10D, 10E, 10F, 10G, 10H, 10I high-frequency filter
20, 20C, 20D, 20G, 20H, 20I variable frequency filter
30, 30C, 30D, 30G, 30H, 30I fixed frequency filter
21, 22 resonant circuit
211, 211D, 211E, 221, 221C, 221F1, 221F2, 211G, 211H, 211I, 221E, 311, 311G, 312G, 313G, 311H, 312H, 313H, 311I, 312I, 313I, 312, 313, 341C, 342C, 341D, 342D, 341E, 342E, 341F, 342F, 343F, 344F piezoelectric resonator
212, 213, 212D, 212E, 212G, 212H, 212I, 213D, 213E, 222, 223, 222C, 223C, 223E, 222F1, 222F2 inductor (extension inductor)
321, 322, 431C, 431E inductor (inductor for fixed frequency filter)
214, 215, 215D, 215E, 224, 225, 225C, 225E, 225F1, 225F2 variable capacitor
213G, 213H, 213I switching element
432D capacitor (capacitor for fixed frequency filter).

The invention claimed is:

1. A high-frequency filter comprising:
a first input-output terminal and a second input-output terminal,
a variable frequency filter including a resonant circuit and a reactance varying unit, wherein a passband frequency and an attenuation band frequency of the variable frequency filter is adjusted by adjusting the reactance varying unit, wherein the resonant circuit is connected in parallel between a transmission line and a ground;
a fixed frequency filter not including the reactance varying unit, the fixed frequency filter having a fixed passband frequency and a fixed attenuation band frequency;
wherein the variable frequency filter is coupled to the fixed frequency filter, and the variable frequency filter and the fixed frequency filter are connected in series between the first input-output terminal and the second input-output terminal, and
wherein the passband of the fixed frequency filter is at least partially overlapped with the passband of the variable frequency filter.

2. The frequency filter according to claim 1,
wherein the variable frequency filter includes a variable filter resonator,
wherein the fixed frequency filter includes a fixed filter resonator, and
wherein the resonant circuit includes the reactance varying unit and the variable filter resonator, wherein a resonant frequency or an anti-resonant frequency is adjusted by the reactance varying unit, whereby the passband or the attenuation band of the variable frequency filter is adjusted.

3. The frequency filter according to claim 2,
wherein the reactance varying unit includes
an inductor connected in parallel to the variable filter resonator; and
a variable capacitor connected in series to the variable filter resonator.

4. The frequency filter according to claim 3,
wherein a lower limit frequency of the passband of the fixed frequency filter is approximately equal to a lower limit frequency of a lowest-frequency communication band, among a plurality of communication bands subjected to a filtering process by the high-frequency filter.

5. The frequency filter according to claim 3,
wherein an upper limit frequency of the passband of the fixed frequency filter is approximately equal to an upper limit frequency of a highest-frequency communication band, among a plurality of communication bands subjected to a filtering process by the high-frequency filter.

6. The frequency filter according to claim 2,
wherein the reactance varying unit includes
an inductor connected in series to the variable filter resonator; and
a variable capacitor connected in parallel to a series circuit composed of the variable filter resonator and the inductor.

7. The frequency filter according to claim 2,
wherein a lower limit frequency of the passband of the fixed frequency filter is approximately equal to a lower limit frequency of a lowest-frequency communication band, among a plurality of communication bands subjected to a filtering process by the high-frequency filter.

8. The frequency filter according to claim 2,
wherein both the fixed frequency filter and the variable frequency filter are low pass filters.

9. The frequency filter according to claim 8,
wherein the reactance varying unit includes
an inductor connected in parallel to the variable filter resonator; and
a variable capacitor connected in series to a parallel circuit composed of the variable filter resonator and the inductor.

10. The frequency filter according to claim 2,
wherein an upper limit frequency of the passband of the fixed frequency filter is approximately equal to an upper limit frequency of a highest-frequency communication band, among a plurality of communication bands subjected to a filtering process by the high-frequency filter.

11. The frequency filter according to claim 1,
wherein both the fixed frequency filter and the variable frequency filter are high pass filters.

12. The frequency filter according to claim 1,
wherein the variable frequency filter includes a variable filter resonator,
wherein the fixed frequency filter includes a fixed filter resonator, and
wherein the reactance varying unit is a unit switching a connection mode of the variable frequency filter to the fixed frequency filter, and the passband and the attenuation band of the variable frequency filter are adjusted by varying a coupling state between the variable frequency filter and the fixed frequency filter through the switching.

13. The frequency filter according to claim 12,
wherein the reactance varying unit includes
an inductor connected in parallel to the variable filter resonator; and
a switching element connected in parallel to the variable filter resonator.

14. The frequency filter according to claim 1,
wherein a lower limit frequency of the passband of the fixed frequency filter is approximately equal to a lower limit frequency of a lowest-frequency communication band, among a plurality of communication bands subjected to a filtering process by the high-frequency filter.

15. The frequency filter according to claim 14,
wherein the fixed frequency filter is a band pass filter or a high pass filter.

16. The frequency filter according to claim 1,
wherein the fixed frequency filter includes a plurality of fixed frequency filters or the variable frequency filter includes a plurality of variable frequency filters, or the fixed frequency filter includes a plurality of fixed frequency filters and the variable frequency filter includes a plurality of variable frequency filters.

17. The frequency filter according to claim 1, wherein an upper limit frequency of the passband of the fixed frequency filter is approximately equal to an upper limit frequency of a highest-frequency communication band, among a plurality of communication bands subjected to a filtering process by the high-frequency filter.

18. The frequency filter according to claim 17, wherein the variable frequency filter is a band pass filter or a low pass filter.

19. A high-frequency filter comprising:
a variable frequency filter including a reactance varying unit, wherein a passband frequency and an attenuation band frequency of the variable frequency filter is adjusted by adjusting the reactance varying unit; and
a fixed frequency filter not including the reactance varying unit, the fixed frequency filter having a fixed passband frequency and a fixed attenuation band frequency,
wherein the variable frequency filter is coupled to the fixed frequency filter,
wherein the passband of the fixed frequency filter is at least partially overlapped with the passband of the variable frequency filter,
wherein the variable frequency filter includes a variable filter resonator,
wherein the fixed frequency filter includes a fixed filter resonator, and
wherein the reactance varying unit is a unit switching a connection mode of the variable frequency filter to the fixed frequency filter, and the passband and the attenuation band of the variable frequency filter are adjusted by varying a coupling state between the variable frequency filter and the fixed frequency filter through the switching, and wherein the reactance varying unit includes
an inductor connected in series to the variable frequency filter; and
a switching element connected in parallel to the variable filter resonator and the serially-connected inductor.

20. A high-frequency filter comprising:
a variable frequency filter including a reactance varying unit, wherein a passband frequency and an attenuation band frequency of the variable frequency filter is adjusted by adjusting the reactance varying unit; and
a fixed frequency filter not including the reactance varying unit, the fixed frequency filter having a fixed passband frequency and a fixed attenuation band frequency,
wherein the variable frequency filter is coupled to the fixed frequency filter,
wherein the passband of the fixed frequency filter is at least partially overlapped with the passband of the variable frequency filter,
wherein the variable frequency filter includes a variable filter resonator,
wherein the fixed frequency filter includes a fixed filter resonator, and
wherein the reactance varying unit is a unit switching a connection mode of the variable frequency filter to the fixed frequency filter, and the passband and the attenuation band of the variable frequency filter are adjusted by varying a coupling state between the variable frequency filter and the fixed frequency filter through the switching, and
wherein the reactance varying unit includes
a resonator and an inductor connected in parallel between a transmission line and a ground; and
a switching element connected between the parallel circuit composed of the resonator and the inductor and the transmission line.

* * * * *